US008324637B2

(12) United States Patent
Ibbetson et al.

(10) Patent No.: US 8,324,637 B2
(45) Date of Patent: Dec. 4, 2012

(54) HIGH EFFICIENCY LEDS WITH TUNNEL JUNCTIONS

(75) Inventors: James P. Ibbetson, Santa Barbara, CA (US); Bernd P. Keller, Santa Barbara, CA (US); Umesh K. Mishra, Montecito, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 12/782,107

(22) Filed: May 18, 2010

(65) Prior Publication Data
US 2010/0224860 A1 Sep. 9, 2010

Related U.S. Application Data

(62) Division of application No. 11/362,472, filed on Feb. 23, 2006, now Pat. No. 7,737,451.

(51) Int. Cl.
*H01L 27/15* (2006.01)
(52) U.S. Cl. ............... 257/81; 257/90; 257/94; 257/104
(58) Field of Classification Search .................... 257/81, 257/90, 94, 104
See application file for complete search history.

(56) References Cited

U.S. PATENT DOCUMENTS

| | | | | |
|---|---|---|---|---|
| 4,198,644 A | 4/1980 | Esaki | ............. | 357/12 |
| 5,338,944 A | 8/1994 | Edmond et al. | ............. | 257/76 |
| 5,679,963 A | 10/1997 | Klem et al. | ............. | 257/46 |
| 5,813,753 A | 9/1998 | Vriens et al. | ............. | 362/293 |
| 6,369,403 B1 | 4/2002 | Holonyak, Jr. | ............. | 257/13 |
| 6,420,736 B1 | 7/2002 | Chen et al. | ............. | 257/99 |
| 6,515,308 B1 | 2/2003 | Kneissl et al. | ............. | 257/86 |
| 6,515,313 B1 | 2/2003 | Ibbetson et al. | ............. | 257/103 |
| 6,526,082 B1 | 2/2003 | Corzine et al. | ............. | 372/46.01 |
| 6,576,488 B2 | 6/2003 | Collins, III et al. | ............. | 438/29 |
| 6,642,652 B2 | 11/2003 | Collins, III et al. | ............. | 313/512 |
| 6,650,044 B1 | 11/2003 | Lowery | ............. | 313/502 |

(Continued)

FOREIGN PATENT DOCUMENTS

JP    03120760    5/1991

(Continued)

OTHER PUBLICATIONS

Office Action from U.S. Appl. No. 11/360,166, Dated: Jun. 23, 2010.

(Continued)

*Primary Examiner* — Anthony Ho
(74) *Attorney, Agent, or Firm* — Koppel, Patrick, Heybl & Philpott (57) ABSTRACT

An LED made from a wide band gap semiconductor material and having a low resistance p-type confinement layer with a tunnel junction in a wide band gap semiconductor device is disclosed. A dissimilar material is placed at the tunnel junction where the material generates a natural dipole. This natural dipole is used to form a junction having a tunnel width that is smaller than such a width would be without the dissimilar material. A low resistance p-type confinement layer having a tunnel junction in a wide band gap semiconductor device may be fabricated by generating a polarization charge in the junction of the confinement layer, and forming a tunnel width in the junction that is smaller than the width would be without the polarization charge. Tunneling through the tunnel junction in the confinement layer may be enhanced by the addition of impurities within the junction. These impurities may form band gap states in the junction.

14 Claims, 2 Drawing Sheets

U.S. PATENT DOCUMENTS

| | | | |
|---|---|---|---|
| 6,878,563 | B2 | 4/2005 | Bader et al. ............ 438/22 |
| 7,816,705 | B2 | 10/2010 | Lee et al. ............ 257/99 |
| 2003/0151042 | A1* | 8/2003 | Hueschen ............ 257/12 |
| 2005/0023549 | A1* | 2/2005 | Gardner et al. ............ 257/99 |

FOREIGN PATENT DOCUMENTS

JP          2002134835          5/2002

OTHER PUBLICATIONS

Office Action from U.S. Appl. No. 11/360,166, Dated: Dec. 8, 2010.
Physics of Semiconductor Devices, $2^{nd}$ Edition, Sze, Wiley Interscience, 1981, Chapter 12, pp. 681-742.
Applied Physics Letters, vol. 78, No. 21, May 21, 2001, Lateral Current Spreading in GaN-Based Diodes Utilizing Tunnel Contact Junctions, Seong et al., pp. 3265-3267.
Applied Physics Letters, Ozden, Takeuchi et al., Oct. 15, 2001, vol. 79, Issue 16, pp. 2532-2534, "A Dual-Wavelength Indium Gallium Nitride Quantum Well Light Emitting Diode".
Solid State Electronics, Brehmer, Zhang et al. 1996, vol. 40, Issues 1-8, pp. 241-244, "Resonant Tunneling Through Rare Earth Arsenide,Semimetal Quantum Wells".
U.S. Publication No. 2005/0023549, Pub. Date Feb. 3, 2005, to Gardner et al.
Ozden I., et al., "A Dual-Wavelength Indium Gallium Nitride Quantum Well Light Emitting Diode", Applied Physics Letters, AIP, American Institute of Physics, Melville, NY, US, vol. 79, No. 16, Oct. 15, 2001, pp. 2532-2534, XP012029138 ISSN: 0003-6951.
Seong-Ran Jeon et al., "GaN-Based Light-Emitting Diodes Using Tunnel Junctions", IEEE Journal of Selected Topics in Quantum Electronics, IEEE Service Center, Piscataway, NJ, US, vol. 8, No. 4, Jul. 2002, XP011066176 ISSN: 1077-260X.
Richard T A et al., "High Current Density Carbon-Doped Strained-Layer GaAs (p<+>)-InGaAs(n<+>)-GaAs(n<+>)p-n Tunnel Diodes" Applied Physics Letters, vol. 63, No. 26, Dec. 1993, pp. 3613-3615, XP002442737.
US Publication No. US 2005/0023549, to Gardner et al., Feb. 2005.
US Publication No. US 2003/0151042, to Hueschen, Mark R. Aug. 2003.
Office Action from U.S. Appl. No. 11/362,472, Mailed on Nov. 30, 2007.
Response to Office Action, U.S. Appl. No. 11/362,472, dated: Apr. 29, 2008.
Office Action from U.S. Appl. No. 11/362,472, Mailed on Jun. 12, 2008.
Response to Office Action, U.S. Appl. No. 11/362,472, dated: Jul. 11, 2008.
Office Action from U.S. Appl. No. 11/362,472, Mailed on Sep. 12, 2008.
Response to Office Action, U.S. Appl. No. 11/362,472, dated: Dec. 12, 2008.
Office Action from U.S. Appl. No. 11/362,472, Mailed on Mar. 4, 2009.
Response to Office Action, U.S. Appl. No. 11/362,472, dated: Jun. 4, 2009.
Office Action from U.S. Appl. No. 11/362,472, Mailed on Sep. 8, 2009.
Response to Office Action, U.S. Appl. No. 11/362,472, dated: Nov. 9, 2009.
Amendment Response to Office Action, U.S. Appl. No. 11/362,472, dated: Dec. 8, 2009.
Notice of Allowance U.S. Appl. No. 11/362,472, mailed Feb. 5, 2010.
Second Office Action in counterpart Chinese Patent Application No. 200780014101.2 mailed Jun. 22, 2010.
Notice of Rejection for Japanese Patent Application No. 2008-556321. dated Feb. 21, 2012.

* cited by examiner

HIGH EFFICIENCY LEDS WITH TUNNEL JUNCTIONS

This is a divisional application from and claims the benefit of U.S. patent application Ser. No. 11/362,472, to Ibbetson et al., filed on Feb. 23, 2006 now U.S. Pat. No. 7,737,451.

BACKGROUND OF THE INVENTION

1. Field of the Invention

The present invention relates to semiconductors devices formed from wide band gap materials, and in particular wide band gap light emitting semiconductor devices utilizing tunnel junctions to increase device light emitting efficiency and to increase the device surface robustness to post growth processing steps.

2. Description of the Related Art

Photonic devices such as light emitting diodes (LED's) and quantum well lasers having a single quantum well (SQW) or multiple quantum wells (MQW) have been fabricated from wide band gap materials. These wide band gap materials include but are not limited to gallium nitride (GaN), indium nitride (InN), aluminum nitride (AlN) and combinations thereof. Photonic semiconductor devices have been described in the *Physics of Semiconductors*, $2^{nd}$ Ed., SZE, Wiley Interscience, 1981 Chapter 12, pp. 681-742. Wide band gap materials are described in *Solid State Electronic Devices*, $2^{nd}$ Ed., Streetman, Prentice Hall, Inc., 1980.

A simple model of a photonic device generally comprises an active region sandwiched between a layer to carry negative charge carriers to the active region and a layer to carry positive carriers to the active region. In the active region the negative carriers and positive carriers can radiatively recombine to generate light. If the active region has a thickness, and a different composition from the two charge carrying layers, a quantum well is formed. The layers on either side of a quantum well are typically called cladding layers. If the active region is a theoretical construct having no thickness, a diode junction is formed. The layers on either side of a junction are typically called confinement layers. For convenience, these layers in either device will be called confinement layers. The confinement layers can extend from the active region to a metal contact layer, or substrate.

Photonic devices made of wide band gap semiconductor materials (e.g. gallium nitride) typically have an n-type confinement layer and a p-type confinement layer confining the active region. One disadvantage of wide band gap p-type confinement layers is that they are more resistive to current flow (i.e. poor electrical conductivity) compared to n-type wide band gap layers. In devices having a p-type layer with good electrical conductivity, a p-type electrical contact can cover a fraction of the surface of the p-type layer. Current flows from the contact throughout the p-type layer, which provides for uniform current injection into the active layer. The contact also covers a small enough area of the p-type layer's that light emitting from the active layer is not blocked by the contact.

In wide band gap p-type layers, however, the resistance to current flow prevents full lateral current spreading throughout the layer from a metal contact with a small footprint. This results in non-uniform current injection into the active layer and reduced efficiency of the overall device.

One way to address the current spreading problem is to use a metal contact that covers most of the surface of the p-type layer. While this does result in effective current spreading, the contact can absorb much of the light emitting from active layer through the p-type layer, reducing the overall efficiency of the device.

Another solution to this problem is to have a multi-layer metal contact on the p-type layer as described U.S. Pat. No. 6,420,736 to Chen, et al. A first layer covers the entire p-type layer and is only a couple of atom layers thick. Chen et al. describes that this layer permits sufficient quantities of light to pass through the metal layer, so that the overall efficiency of the device is acceptable. A second metal layer being thicker, and making more robust contact, covers a fraction of the footprint of the active device. This robust metal layer, however, will be opaque to the light generated by the active region. The absorbing p-type ohmic contact metal that is used in semi-transparent contacts for p-type up devices reduces the brightness generated by the photonic device.

Some metals capable of forming ohmic contacts to wide band gap p-type layers do not effectively adhere to the surface of the p-type layer. This poor adherence can require the deposition of a two-layer semi-transparent window for the p-type metal contact. A first layer of this contact would be deposited directly on the p-type layer to adhere to the semiconductor surface. A second layer of metal is deposited on the first layer to enhance lateral current spreading across the footprint of the active region.

Another characteristic of p-type wide band gap layers is that they are more fragile than n-type wide band gap layers, which can lead to complications in processing wide band gap photonic devices. For example, when the top surface of a wide band gap photonic device is p-type, great care must be taken during all steps of device processing to minimize damage to the exposed surface of the p-type layer. This is especially difficult in photonic devices where many processing takes place after the deposition of the p-type layers.

One approach to surmounting these problems in p-type devices has been to fabricate a tunnel junction within the p-type confining layer between the active region and the metal electrode layer. This junction allows the p-type carriers to be converted into n-type carriers permitting deposition over the p-type layer of an n-type layer. The n-type layer has benefits that include but are not limited to being more robust during processing, having lower resistance than p-type layers and being more efficient at lateral current spreading than p-type layers. This approach has been described by Seong-Ran Jeon et. al., "Lateral Current Spreading in GaN-Based Light-Emitting Diodes Utilizing Tunnel Contact Junctions," Applied Physics Letters, Volume 78, No. 21, pp. 3265-3267, 21 May 2001. Jeon used a tunnel diode junction in the p-type confinement layer to convert the charge carriers to n-type.

One difficulty with this approach is tunnel diodes in wide band gap materials tend to be inefficient and highly resistive to current flow. Tunnel junctions formed in wide band gap materials have a tunnel width that has a resistance to tunneling. The size of the tunnel width and its resistance to tunneling increases with an increasing band gap width, and decreases with increasing doping at the junction. The band gap of wide band gap materials tends to significantly degrade the performance of the tunnel junction, while the saturation level of dopants in wide band gap materials is such that even degenerate doping does not reduce the resistance to tunneling encountered by the wide band gap material sufficient to make the device efficient.

A tunnel junction contact to a p-type confinement layer in a wide band gap photonic device with a low tunneling resistance is difficult to form, because of the large band gap and doping limitations that prevent the formation of very thin tunnel widths. A thin tunnel junction in a p-type confinement layer would result in a lower resistance to tunneling, higher current flow through the electrode and a more efficient photonic device.

SUMMARY OF THE INVENTION

One embodiment of a high efficiency wide band gap semiconductor photonic device p-type confinement layer according to the present invention comprises a first semiconductor layer having a first composition in metallic contact with and disposed between second and third semiconductor layers having compositions dissimilar to the first layer. The second semiconductor layer is p-type, and the third semiconductor layer is n-type. A tunnel junction, having a tunnel width and a resistance to tunneling, is formed from the second, first and third layers, and is adapted to permit charge carriers in the second layer to transition into charge carriers having an opposite polarity. A natural dipole associated with the dissimilar materials is used to form the junction such that the width is smaller than a width in the junction would be in the absence of the first layer.

One embodiment of a light emitting diode (LED) according to the present invention comprises a first n-type layer of Group III nitride semiconductor material and a p-type layer of Group III nitride semiconductor material. It also comprises an active region of Group III nitride semiconductor material sandwiched between the n-type and p-type layers. A second n-type layer of Group III nitride semiconductor material is included along with a tunnel junction between the p-type layer and second n-type layer. A bias applied across the first and second n-type layers causes the active region to emit light.

Another LED according to the present invention comprises a plurality of emitter structures arranged on top of each other in vertical alignment. Each of the emitter structures comprises a first n-type layer, a p-type layer, and an active region sandwiched between the n-type and p-type layers. The LED also comprises a plurality of second n-type layers, one of which is arranged between each of the emitter structures that are adjacent, and one of which is arranged above the top emitter structure. A plurality of tunnel junctions is also included each of which is between one of the plurality of second n-type layers and the p-type layer of one of the plurality of emitter structures. A bias applied across the first n-type layer in the bottom most of the emitter structures and the top one of the second n-type layers causing the active regions in the plurality of emitter structures to emit light.

One embodiment of a method according to the present invention for fabricating a low resistance p-type confinement layer having a tunnel junction in a wide band gap semiconductor p-type confinement layer comprises generating a polarization charge in the junction of the confinement layer. A tunnel width is formed in the junction that is smaller than the width of the junction would be in the absence of the polarization charge.

These and other features and advantages of the invention will be apparent to those skilled in the art from the following detailed description, taken together with the accompanying drawings, in which:

DETAILED DESCRIPTION OF THE INVENTION

The following describes devices having a construction with crystal layers grown normal to a polar direction of the crystal. In one embodiment, device layers are presumed to have the Wurtzite crystal structure with layers comprising gallium nitride (GaN), indium gallium nitride ($In_xGa_yN$), and aluminum gallium nitride ($Al_xGa_yN$) where $0.3 \leq x \leq 1.0$ and $x+y=1.0$. Except where noted, the top surface of the crystal has (0001) orientation with Periodic Table group III polarity.

The devices disclosed comprise semiconductor materials typically prepared by epitaxial growth methods. Epitaxial growth methods grow uniform two-dimensional surfaces where variations in compositions and doping may be made in a third dimension as growth proceeds over time. Typically, these structures are grown by molecular beam epitaxy (MBE) or metal organic chemical vapor deposition (MOCVD). However, other equally useful methods of epitaxial growth may be used to achieve these ends.

Some of the following figures are illustrative sectional views of device structures that have been grown by various epitaxial techniques. Each such figure includes a substrate referenced within the figure. It is to be understood that epitaxial growth typically starts at the surface of the substrate, with successive layers grown on top of one another. In some devices a metal layer is included as the top layer, but metal is typically not deposited by epitaxy. Instead, a different processing step, such as sputtering, is used to deposit the metal.

Figure 1:
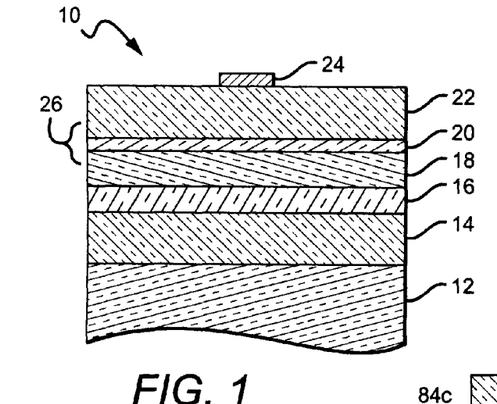
FIG. 1 is a sectional view of one embodiment of a light emitting diode (LED) according to the present invention, having a tunnel junction to aid current spreading from the p-type contact.

FIG. 1 shows one embodiment of light emitting diode (LED) according to the present invention comprising a tunnel junction arrangement connecting a metal layer to a p-type confinement layer. In one embodiment the LED 10 is fabricated in GaN material system, although it can also be fabricated from many other material systems alone or in combination. As described above, the LED 10 can be fabricated using conventional fabrication processes.

The LED 10 comprises a substrate 12 that can be made of many different materials such as GaN, silicon carbide or sapphire. SiC is a suitable material because it has a closer crystal lattice match to Group III nitrides such as GaN and results in Group III nitride films of high quality. Silicon carbide also has high thermal conductivity so that the total output power of Group III nitride devices on silicon carbide is not limited by the thermal dissipation of the substrate (as is the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022. In other embodiments the substrate can be GaN and the photonic device can be deposited on a polar surface of the substrate.

The LED 10 also comprises a first n-type layer 14 that serves two functions. First, the portion of layer 14 that is adjacent to the substrate 12 serves as a buffer/nucleation layer, and the details of these layers are generally well known in the art and are only briefly discussed herein. The buffer/nucleation portion of layer 14 reduces the defects in the epitaxial growth as growth proceeds in layer 14, away from the interface with substrate 12. A second purpose of layer 14 is to act as a confinement layer to the LED's active region. Layer 14 can be made of many different materials, with a preferred material being n-type GaN. In other embodiments of LEDs according to the present invention, layer 14 can be two separate layers, one of which is a buffer/nucleation layer and the other being an n-type confinement layer. The buffer/nucleation layer would typically be sandwiched between the substrate 12 and n-type confinement layer.

The LED 10 further comprises an active region 16 fabricated on layer 14 with layer 14 providing physical support for the active region. A p-type GaN confinement layer 18 is formed on the active region 16, and in combination with the active region 16 and the n-type confinement layer 14, forms the basic photonic layers of the LED 10. In operation, n-type carriers from layer 14 combine with p-type carriers from layer 18 to generate light in the active region. In this embodiment active region 14 is a region having quantum wells. These quantum wells may be fabricated from indium gallium nitride (InGaN). Active region 14 may have a single quantum well or it may have multiple quantum wells. In one embodiment active region 14 may be a theoretical construct having a physical thickness of zero. In that case, p-type layer 18 and n-type layer 14 form a p-n junction at 14.

The LED 10 also comprises a p-type AlGaN layer 20 on the p-type layer 18 and an n-type GaN layer 22 on the p-type AlGaN layer. In accordance with the present invention, p-type GaN layer 18 combines with p-type AlGaN layer 20 and the bottom portion of n-type GaN layer 22 to form tunnel junction 26. Tunnel junction 26, as appearing in FIG. 1, includes the bottom portion of layer 22, the top portion of layer 18 and all of layer 20. In this embodiment layer 20, being a p-type AlGaN layer, has a different band gap than either layer 18 or layer 22. This dissimilarity in the band gap of layer 20 sandwiched between layers 18 and 22 generates a dipole moment. This dipole moment shortens the tunnel width of a tunnel junction as formed at 19 over what the width of the tunnel junction would be in the absence of layer 20.

Second n-type GaN layer 22 allows contact to be made to the upper portion of the device, as shown in FIG. 1, by metal layer 24. Metal layer 24 is arranged to apply a current to the p-type layer and works in conjunction with a second metal layer that is arranged to apply a current to n-type GaN layer 14. This allows a bias to be applied across the LED 10 to cause its active region 16 to emit light. As mentioned above, a metal layer forming an ohmic contact with an n-type GaN layer requires a smaller footprint than a metal layer forming an ohmic contact with a p-type GaN layer. Also, the n-type GaN layer 22 has a greater carrier mobility that enhances the uniformity of the carrier current into the active region 16 of the LED 10. Increased uniformity in the current entering the active region 16 produces an increase in efficiency of the LED 10, maximizing the amount of light generated in active region 16.

In this embodiment, p-type AlGaN layer 20 is approximately 0.3 to 5 nanometers (nm.) thick, although other thicknesses also can work. AlGaN layer 20 is typically between 30 and 100% aluminum, although other percentages of aluminum can also work. The higher the fraction of aluminum in layer 20, the stronger the dipole moment in junction 26 will be. The stronger the dipole moment in junction 26 is, the narrower the tunnel width will be across the junction.

As the concentration of aluminum in layer 20 increases so does the difficulty in growing the transition from layer 18 to layer 20, and the transition from layer 20 to layer 22 with high quality crystals. It is possible to experimentally determine an optimum concentration of aluminum in layer 20 to maximize the strength of the dipole acting on junction 26 and minimize the negative affects on the quality of the crystal growth.

Layer 22, with its higher carrier mobility than either layers 20 or 18, allows charge carriers entering layer 22 from metal layer 24 to be distributed evenly and uniformly across the footprint of active region 16. N-type charge carriers uniformly cross the transition between layer 22 and layer 20 over the footprint of active region 16. No further lateral current spreading is required so the charge carriers may proceed through tunnel junction 26 and into the p-type layer 18 where the n-type charge carriers convert to p-type charge carriers. This allows for near uniform carrier injection into the active region 16 from the p-type layer. Layer 20 reduces the bias required for the charge carriers in layer 22 to cross junction 26 making LED 10 more efficient.

An optimized tunnel junction achieves efficient lateral current spreading, which makes a semitransparent metal contact layer obsolete. Absence of the semitransparent metal contact layer increases the efficiency and the power delivered by the device because the semitransparent spreading metal is not absorbing light generated by the active region 14. Production of this device is made simpler by simplified contact metallization steps that eliminate one photolithography step, because there is only one metal layer type to deposit.

In addition, by the LED having an upper surface from the n-type GaN layer 22 the danger of damage to the surface is reduced compared to structures having a p-type material on the upper surface. The surface provided by the n-type GaN layer 22 is a more robust processing surface so that the likelihood of damage to the surface of the LED 10 is reduced compared to LEDs having a p-type layer as the top surface.

Figure 2:
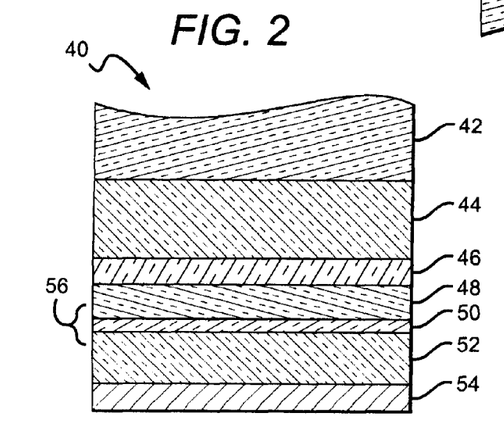
FIG. 2 is a sectional view of another LED according to the present invention that is flip-chip mounted.

FIG. 2 shows another embodiment of an LED 40 according to the present invention that comprises layers similar to those in LED 10, but LED 40 is flip-chip mounted such that LED light emits primarily through the substrate 42. The LED 40 also utilizes a low resistance p-type confinement layer and tunnel junction arrangement to enable the deposition of highly reflective metal contacts. Metal contacts capable of making ohmic contact to a p-type wide band gap semiconductor material, such as GaN, tend to form lossy reflectors. However, metals capable of forming ohmic contacts to n-type wide band gap semiconductor materials, such as GaN, tend to form stable, easy to fabricate, and highly reflective metal contacts. Metals capable of making highly reflective contact to n-type wide band gap semiconductor materials include, but are not limited to, aluminum, silver and gold.

The structure in FIG. 2 is grown on substrate 42, which can be made of the same materials and substrate 12 in FIG. 1. First n-type layer 44 is similar to layer 14 in FIG. 1 and reduces the defects in the epitaxial growth as growth proceeds in layer 44, away from the interface with substrate 42. Layer 44 also acts as an n-type confinement layer to the LED's active region. Layer 44 can be made of many different materials, with a preferred material being n-type GaN, and in other embodiments of an LED according to the present invention, layer 44 can comprise a separate buffer/nucleation layer and a separate n-type confinement layer.

LED 40 also comprises an active region 46 and a p-type GaN confinement layer 48 similar to active region 16 and p-type confinement layer 18 in FIG. 1, with the active region 46 sandwiched between the p-type confinement layer 48 and n-type confinement layer 44. A bias applied across the p-type and n-type layers 44, 48 causes the active region 46 to emit light. However, because LED 40 is flip-chip oriented, the useful LED light emits through the substrate 42. To improve the efficiency of LED 40, it is desirable to have a reflective surface to reflect light emitting from the active region 46, toward and through the p-type layer 48. However, as described above, it is difficult to deposit an effective reflector on the surface of p-type GaN material, as well as other Group III nitride materials.

To allow for an effective reflector to be deposited on the LED 40, it also comprises a p-type AlGaN layer 50 and an a second n-type GaN layer 52, with the p-type AlGaN layer sandwiched between the n-type GaN layer 52 and the p-type GaN layer 48. This layer combination forms a tunnel junction 56, and the p-type AlGaN layer 50 generates a dipole that reduces the tunnel width of tunnel diode junction 56, as described above in LED 10. By having n-type GaN layer 52 as the top surface of LED 40, a reflective contact metal 54 can be deposited on an n-type material instead of p-type.

Reflective metal 54 serves both as a reflector and a electrical contact used to apply a bias to the p-type layer 48, with current spreading from the contact and into the active region as described in the LED 10 in FIG. 1. The reflective layer 54 covers the entire footprint of active region 46, but rather than reduce the brightness or efficiency of the LED 40, reflective contact metal layer 54 increases brightness and efficiency. N-type GaN is transparent to most types of light generated by wide band gap materials. As such, light generated in active region 46 passes through the n-type GaN confinement layer 44 and proceeds through the substrate 42. Light leaving active region 14 in the direction of p-type GaN confinement layer 48, passes through the p-type GaN confinement layer 48, p-type AlGaN layer 50 and second n-type GaN layer 52. The light then reflects off reflective contact metal 54, back toward the substrate 42 and exits the LED 40 through the substrate 42 to contribute to the emission of the LED 40. Without the reflective contact metal, all or most of the light emitting toward the p-type confinement layer 48 would not contribute to the emission of the LED 40.

P-type AlGaN layer 50 reduces the tunnel width, and therefore the resistance to tunneling of tunnel junction 56 over the tunnel width and resistance that would be present in the absence of layer 50. In another embodiment according to the present invention, the thickness of p-type GaN confinement layer 48 can be reduced to minimize the amount of LED light that is absorbed by the p-type confinement layer when light from the active region passes through it.

Figure 3:
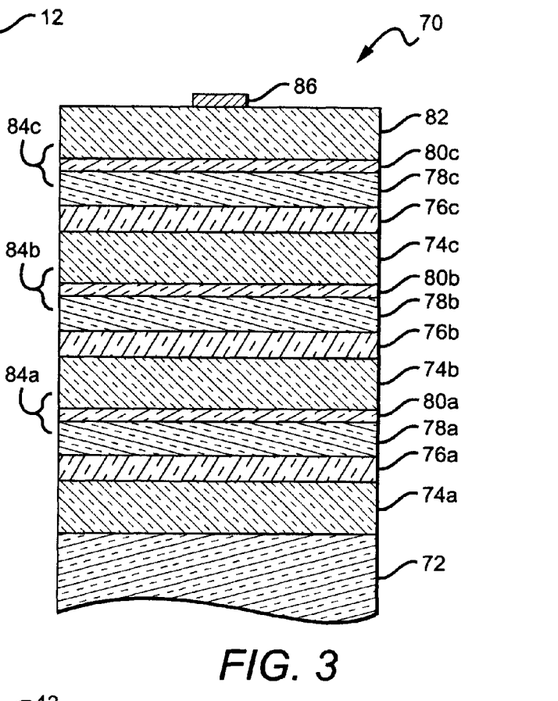
FIG. 3 is a sectional view of another LED according to the present invention, having a plurality of vertically mounted emitter structures.

FIG. 3 shows another embodiment of an LED 70 according to the present invention that exhibits high luminous flux and comprises multiple vertically integrated active regions. Each active region can operate at the same current density as a single conventional photonic device. The two terminal device, which can have a footprint equal to the corresponding standard device, also operates at a voltage that is equivalent to the operating voltage of a single device, multiplied by the number of junctions in the device. Light output increases with an increase in the number of active regions.

As fully described herein, LED 70 comprises three vertically integrated active regions. The device structure of LED 70 has accordingly been divided into three devices keeping in mind that this device can be formed in a single growth, and requires only two contacts, although other devices according to the present invention can have more than two contacts. Layer of the LED 70 are grown on substrate 72, which can be made of the same materials of substrates 12, 42 shown in FIGS. 1 and 2 respectively.

A first emitting structure is grown on substrate 72, and comprises an n-type GaN confinement layer 74a, which also serves as a buffer layer and a nucleation layer to enhance the quality of the GaN crystal grown. The first emitting structure also comprises an active region 76a and a p-type GaN confinement layer 78a, with the active region 76a sandwiched between the p-type and n-type confinement layers 74a and 78a. P-type GaN confinement layer 78a combines with active region 76a and n-type GaN confinement layer 74a to form an emitting device wherein the active region 76a emits light in response to a bias applied across the p-type and n-type confinement layers 78a, 74a. The LED 70 also comprises a similar second emitting device having an n-type GaN confinement layer 74b, active region 76b, and p-type confinement layer 78b, vertically oriented over the first emitting structure. A third emitting structure is also included having an n-type GaN confinement layer 74c, active region 76c, and p-type confinement layer 78c, vertically oriented over the second emitting structure.

A first p-type AlGaN layer 80a is arranged between the p-type layer 78a of the first emitter structure and the n-type layer 74b of the second structure. Similarly, a second p-type AlGaN layer 80b is arranged between the p-type layer 78b of the second structure and the n-type layer 74c of the third structure. LED 70 also comprises a third p-type AlGaN layer on the p-type layer 78c and a top n-type GaN layer 82 on the third p-type AlGaN layer 80c.

Each of the first, second and third p-type AlGaN layers 80a, 80b and 80c form a tunnel junction with its surrounding layers. For example, first p-type AlGaN layer 80a, the bottom portion of n-type GaN confinement layer 74b and top portion of p-type confinement layer 78a form first tunnel junction 84a. Second p-type AlGaN layer 80b, the bottom portion of n-type confinement layer 74c, and top portion of p-type confinement layer 78b form second tunnel junction 84b. Third p-type AlGaN layer 80c, bottom portion of top n-type layer 82 and top portion of p-type confinement layer 78c form third tunnel junction 84c.

The dipole generated at each of the tunnel junctions 84a, 84b, 84c by the presence of its respective p-type AlGaN layer 80a, 80b, 80c reduces the tunnel width and the resistance to tunneling over that which would be present in the absence of layers. This increases the efficiency of each of the tunnel junctions 84a, 84b, 84c. The p-type AlGaN layers can be many different thicknesses and can have different percentages of Al, with a suitable p-type AlGaN layer being between 0.3 to 5.0 nm thick, and 30 to 100% Al.

The tunnel junctions 84a, 84b, 84c spread current from the p-type metal contact 86 to all three active regions 76a, 76b, 76c such that each active region emits light in response to a bias applied across p-type metal contact 86 and n-type contact (not shown). Tunnel junction 84c spreads current from the contact 86 through the p-type layer 78c, similar to the tunnel junction 26 described above in FIG. 1. This allows for near uniform current injection from the p-type metal contact into the active region 76c.

N-type current leaving tunnel junction 84a enters n-type GaN confinement layer 74b. Tunnel junction 19a has permitted p-type confinement layer 78a to make a lower resistance inverse contact to n-type GaN confinement layer 74b. The inverted charge carrier traveling through layer 74b enter active region 76b and exits as positive charge carriers in p-type GaN confinement layer 78b. This cycle repeats on up the device until n-type GaN layer 82 is reached. Layer 82 allows a robust processing surface on which a simple contact to n-type metal layer 10 may be formed. A similar process allows p-type current to travel from the p-type contact 86, through the layer of the LED 70. By having n-type and p-type current flowing through the LED layers, all of the active regions can emit light simultaneously from a bias applied across the n-type and p-type contacts.

The structure in FIG. 3 allows for the formation of multiple two terminal photonic devices in series in a single growth. Dipoles generated at tunnel junctions 84a, 84b, 84c reduce the tunnel width, and resistance to tunneling, which increases the efficiency of LED 70. In one embodiment according to the present invention, each active region 76a, 76b, 76c can comprise a different material composition. The wavelength of light generated by an active region is a function of the band gap of that active region and the band gap of an active region is determined by its composition. Having different compositions allows each of the three active regions 76a, 76b, 76c to generate different wavelengths, or colors, of light. These wavelengths of light can then combine with one another to a fourth and different wavelength of light. In one embodiment according to the present invention, the light from the active regions 76a, 76b, 76c can emit different wavelengths of light that combine to produce white light.

Furthermore, the structure in FIG. 3 allows for the possibility of operating photonic devices at current densities where the device efficiency is the highest. GaN wide band gap photonic devices have an efficiency peak at current densities of approximately 2-5 miliamps (mA). This embodiment would increase the light output at low input power as well. A three active region in series photonic device, for instance, could operate at 12 volts and 5 mA and achieve approximately a 30% higher light output due to the higher quantum efficiency at low current densities than a single LED operating at 3 volts and 20 mA.

Figures 4, 5, 6, 7:
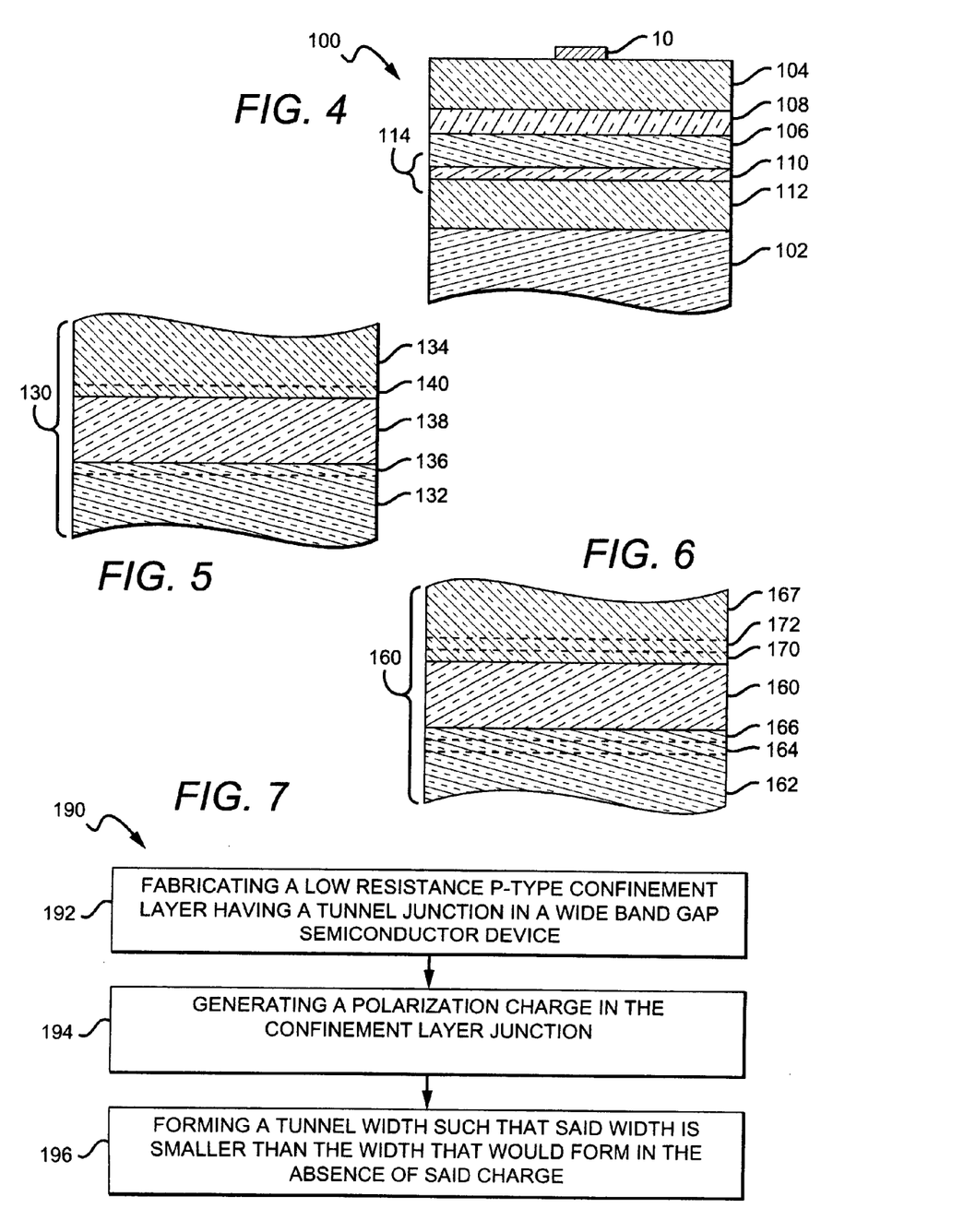
FIG. 4 is a sectional view of still another LED according to the present invention, having an inverted emitter structure.
FIG. 5 is a sectional view an embodiment of a tunnel junction according to the present invention.
FIG. 6 is a sectional view of another tunnel junction according to the present invention.
FIG. 7 is a flow chart illustrating a method of fabricating one embodiment of a low resistance tunnel junction contact to a p-type confinement layer.

FIG. 4 shows another embodiment of an LED 100 according to the present invention comprising an inverted photonic device structure in a wide band gap semiconductor material, such as GaN/AlGaN. LED 100 comprises a substrate 102 that can be made of the same material as substrate 12 in FIG. 1. The LED 100 includes an inverted emitting structure with a first n-type GaN confinement layer 104 on top, a p-type GaN confinement layer 106 below it, and an InGaN active region 108 sandwiched between the two. Below the p-type GaN layer 106 is a p-type AlGaN layer 110, and below it is a second n-type GaN layer 112. A tunnel junction 114 is formed by the bottom portion of p-type layer 110, the p-type AlGaN layer 110, and the top portion of the second n-type layer 112.

An advantage of LED 100 is its ability to eliminate or minimize the affects of spontaneous and piezoelectric polarization, which causes a spatial separation of electrons and holes in the conduction and valence bands. This embodiment thus increases the efficiency of the rate of radiative recombination. The external field in an inverted LED operation with current flowing opposes the external polarization fields. With optimized structure design, the internal fields can be largely reduced and therefore lead to more efficient photonic devices. In another embodiment of an LED according to the present invention, the inverted structure and tunnel junction of LED 100 can also be arranged with a plurality of emitter structure vertically oriented in a fashion similar to the structure described in FIG. 3, to fabricate a high flux LED.

The devices above provide the described advantages by using a tunnel junction that comprises a layer of dissimilar material between n- and p-type layers to generate a dipole moment that shortens the tunnel width. However, other types of tunnel junctions can also be used. FIG. 5 is a sectional view of another embodiment of a tunnel junction 130 according to the present invention that can be used in the devices above, and is generally arranged in combination with a p-type confinement layer. Impurities are introduced near the physical location of the tunnel junction during growth of the structure that generate mid band gap, or mid gap, states.

In the tunnel junction 130 a degenerately doped p-type gallium nitride layer 132 is grown first, and normally the tunnel junction would be grown to completion when degenerately doped n-type gallium nitride layer 134 is grown in metallic contact on top of layer 132. However in tunnel junction 130, as growing proceeds toward the end of the growth of layer 132, before transitioning to the growth of layer 134, impurities may be added to layer 132 to induce deep states in the band gap of the to be formed junction. The impurities can be introduced into growth layer 132 at first impurity portion 136 and can be added continuously or in one or more atomic layers. The impurities in first portion 136 should be acceptor impurities so they do not interfere with the overall charge of layer 132.

Dissimilar layer 138 is then grown on first impurity portion 136 and in one embodiment according to the present invention, dissimilar layer 136 can comprise 0.3 to 5.0 nm of p-type $Al_xGa_yN$ where $0.3 \leq x \leq 1.0$ and $x=y=1.0$, although other thicknesses and composition can also be used. In another embodiment according to the invention, dissimilar layer 138 can be a tunnel junction having a physical thickness of zero.

Layer 134 is then grown on dissimilar layer 138 and just after the transition from layer 138 to layer 134, second impurity portion 140 can be grown transitioning into layer 134. Impurity portion 140 can be degenerately doped n-type gallium nitride with the addition of impurities to add deep states into the band gap. The impurities and the deep states introduced into the band gap from second impurity 140 should be donors, so as not to interfere with the charge of layer 134. In one embodiment according to the present invention, the density of states can be approximately $10^{19}/cm^3$, or higher, although other densities of states can also be used.

Once these impurities or defects have been grown in first and second impurity portions 136, 140, intermediate band gap states are introduced into the junction region of the tunnel junction 130. These intermediate band gap states reduce the tunnel width of junction 130 by allowing carriers to tunnel part way through the gap, and then continue on to complete the tunneling. The states may also contribute to lowering the tunnel width by forming a space charge at junction 130 which can move the tunnel junction band gaps closer together.

FIG. 6 shows another embodiment of a tunnel junction 160 that is similar to tunnel junction 130 in FIG. 5 and can be used in the photonic devices described above in FIGS. 1-4. Tunnel junction 160 includes a variety of states added to its junction region. Degenerately doped p-type gallium nitride layer 162 is grown first and as near the end of its growth, impurities are introduced to form the first impurity portion 164 that have a particular type of deep mid gap state. After impurity portion 164 is grown, second impurity portion 166, with a slightly shallower mid gap state can be grown. After second impurity 166 is grown, dissimilar layer 168 can be grown on it.

In one embodiment, dissimilar layer 166 comprises 0.3 to 5.0 nm of p-type $Al_xGa_yN$ where $0.3 \leq x \leq 1.0$ and $x=y=1.0$, although other thicknesses and densities can be used. Once dissimilar layer 166 is grown, there is a carrier transition from p-type to n-type when n-type layer 167 is grown. Third impurity portion 170 is grown at the transition to n-type layer 11 and has a deep mid gap state donor deposited within it. Fourth impurity portion 172 having a shallow mid gap state is then grown and degenerately doped n-type gallium nitride layer 167 is grown after the above transition.

A range of different impurities and states can be introduced to provide a quasi-continuous staircase across the tunnel width. This quasi-continuous staircase could be most ideally likened to a metal transition. The conduction of carriers across this width will be almost metal like. Deep states introduced into the high field region or tunnel width tunnel junction 160 should have concentrations in the $10^{19}/cm^3$, to the $10^{20}/cm^3$ range to get the maximum benefit, and prevent saturation at high current. Saturation occurs when all the available states are taken up by current tunneling across the width leaving excess current unable to tunnel.

FIG. 7 shows a flow diagram of one embodiment of a method 190 for forming a semiconductor device having a tunnel junction according to the present invention. A low resistance p-type confinement layer having a tunnel junction in a wide band gap semiconductor device is fabricated in block 192. A polarization charge is generated in the confinement layer junction in block 194. A tunnel width that is smaller than the width that would form in the absence of said charge is formed in block 196.

The dissimilar material may be placed at the junction during growth. Growth of these structures typically is performed by MBE or MOCVD, however other methods of epitaxial growth may be used to fabricate the structures. Growth conditions optimized for GaN are usually significantly different than optimal growth conditions for InGaN, or AlGaN. Transitions in the growth conditions from one material to another must be handled with care, as there will be an intermediary period when conditions are such that neither material will grow high quality crystals.

The fraction of In or Al in the composition of the dissimilar materials may be from 30 to 100%. The larger the fraction of aluminum in the dissimilar material in the junction, the greater the polarization effect on the tunnel junction. However, the higher the fraction of aluminum in the dissimilar material there is, the more difficult it is to grow high quality crystals of that material.

In one embodiment, growth may be interrupted while new growth conditions stabilize. Abrupt interfaces at these heterojunctions provide narrow junctions with steep gradients. However, the material interface is subject to contamination deposition at the surface during growth interruptions.

In one embodiment, composition transitions are ramped during changes in growth conditions. This stretches the dipole effect over greater distances, reducing the impact it has on band bending. The weakened band bending caused by the ramped transitions, results in less shortening of the tunnel junction.

Although the present invention has been described in considerable detail with references to certain preferred configurations thereof, other versions are possible. Therefore the spirit and scope of the claims should not be limited to the preferred version contained herein.

We claim:

1. A high efficiency wide band gap semiconductor photonic device including a p-type confinement layer comprising:
    a first semiconductor layer having a first composition in metallic contact with and disposed between second and third semiconductor layers having compositions dissimilar to said first semiconductor layer, said second semiconductor layer being p-type, and said third semiconductor layer being n-type; and
    a tunnel junction, having a tunnel width and a resistance to tunneling, formed from said second, first and third semiconductor layers, adapted to permit charge carriers in said second semiconductor layer to transition into charge carriers having an opposite polarity, wherein a natural dipole associated with said dissimilar materials is used to form said tunnel junction such that said width is smaller than a width in said tunnel junction would be in the absence of said first semiconductor layer, wherein said tunnel junction comprises an impurity located in said second and third semiconductor layers near said tunnel junction forming band gap states within said width.

2. The apparatus of claim 1, wherein said semiconductor photonic device comprises a material from the periodic table group III-nitride material system.

3. The apparatus of claim 1, wherein said first semiconductor layer is approximately 0.3 to 5 nanometers thick.

4. The apparatus of claim 1, wherein said first semiconductor layer comprises an $In_xGa_yN$ layer sandwiched between said third semiconductor layer and said second semiconductor layer, said third semiconductor layer being a highly doped n-type GaN layer and said second semiconductor layer being a highly doped p-type GaN layer, where x+y=1.

5. The apparatus of claim 1, wherein said first semiconductor layer comprises an $Al_xGa_yN$ layer sandwiched between said second semiconductor layer and said third semiconductor layer, said second semiconductor layer being a highly doped p-type GaN layer and said third semiconductor layer being a highly doped n-type GaN layer, where x+y=1.

6. The apparatus of claim 1, wherein said tunnel junction provides an efficient method of lateral current spreading.

7. The apparatus of claim 1, wherein said tunnel junction allows replacement of a light absorbing p-ohmic contact metal with a highly reflective n-ohmic contact metal.

8. The apparatus of claim 1, wherein a plurality of said tunnel junctions allows a plurality of vertically integrated bipolar active regions to be in series.

9. The apparatus of claim 1, wherein said tunnel junction allows inverting the polarity of a light emitting diode structure.

10. A high efficiency wide band gap semiconductor photonic device including a p-type confinement layer comprising:
    a first semiconductor layer having a first composition in metallic contact with and disposed between second and third semiconductor layers having compositions dissimilar to said first semiconductor layer, said second semiconductor layer being p-type, and said third semiconductor layer being n-type;
    a tunnel junction, having a tunnel width and a resistance to tunneling, formed from said second, first and third semiconductor layers, adapted to permit charge carriers in said second semiconductor layer to transition into charge carriers having an opposite polarity, wherein a natural dipole associated with said dissimilar materials is used to form said tunnel junction such that said width is smaller than a width in said tunnel junction would be in the absence of said first semiconductor layer, wherein said tunnel junction comprises an impurity located in said second and third semiconductor layers near said tunnel junction forming band gap states within said width; and
    a plurality of energetically distinct impurities located in said second and third semiconductor layers near said tunnel junction forming a plurality of band gap states that provide a quasi-continuous tunneling path within said width.

11. The apparatus of claim 10, wherein said impurities are the result of a placement in the junction region comprising one of the group consisting of native defects in semiconductor material, dislocations, extended crystal defects, metallic or semi-metallic islands or quantum wells, doping with rare earth impurities, doping with metal ions, implantation, and impurity diffusion.

12. The apparatus of claim 10, further comprising an n-type side of said tunnel junction, and a p-type side of said tunnel junction, wherein said band gap states form a like type of carrier on their respective sides of said tunnel junction.

13. The apparatus of claim 12, wherein said tunnel junction comprises an n-type junction layer having a charge carrier concentration of about $6 \times 10^{19}/cm^3$ or higher.

14. The apparatus of claim 12, wherein said tunnel junction comprises a p-type junction layer having a charge carrier concentration of about $3 \times 10^{19}/cm^3$ or higher.

* * * * *